United States Patent
Sun et al.

(10) Patent No.: US 10,651,429 B2
(45) Date of Patent: May 12, 2020

(54) ORGANIC LIGHT-EMITTING DIODE (OLED) ILLUMINATING LAMP SHEET AND MANUFACTURING METHOD THEREOF

(71) Applicant: BOE TECHNOLOGY GROUP CO., LTD., Beijing (CN)

(72) Inventors: Jie Sun, Beijing (CN); Chung Chun Lee, Beijing (CN); Chieh Hsing Chung, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 69 days.

(21) Appl. No.: 15/570,891

(22) PCT Filed: Apr. 12, 2017

(86) PCT No.: PCT/CN2017/080239
§ 371 (c)(1),
(2) Date: Oct. 31, 2017

(87) PCT Pub. No.: WO2018/028232
PCT Pub. Date: Feb. 15, 2018

(65) Prior Publication Data
US 2019/0051866 A1    Feb. 14, 2019

(30) Foreign Application Priority Data
Aug. 9, 2016   (CN) .......................... 2016 1 0647462

(51) Int. Cl.
*H01L 51/56* (2006.01)
*H01L 51/52* (2006.01)
*H01L 27/32* (2006.01)

(52) U.S. Cl.
CPC .......... *H01L 51/56* (2013.01); *H01L 27/3239* (2013.01); *H01L 27/3246* (2013.01);
(Continued)

(58) Field of Classification Search
None
See application file for complete search history.

(56) References Cited

U.S. PATENT DOCUMENTS 9,240,573 B2 * 1/2016 Paek .................... H01L 27/3211
9,373,824 B2 * 6/2016 Paek .................... H01L 27/3211
(Continued)

FOREIGN PATENT DOCUMENTS

CN   101983399 A   3/2011
CN   102148234 A   8/2011
(Continued)

OTHER PUBLICATIONS

Search Report and Written Opinion dated Jul. 21, 2017 from State Intellectual Property Office of the P.R. China.
(Continued)

*Primary Examiner* — Abul Kalam
(74) *Attorney, Agent, or Firm* — Dilworth & Barrese, LLP.; Michael J. Musella, Esq.

(57) ABSTRACT

An organic light-emitting diode (OLED) illuminating lamp sheet and a manufacturing method thereof are provided. The method for manufacturing an OLED illuminating lamp sheet includes: manufacturing an array substrate, the array substrate includes a first base and a first electrode formed on the first base; bonding an electrostatic film to a surface of the array substrate provided with the first electrode, forming a patterned electrostatic film by patterning the electrostatic film, and forming an organic film layer by taking the patterned electrostatic film as a mask; forming a second electrode and obtaining an OLED element; and encapsulating the OLED element and obtaining an OLED illuminating lamp sheet.

15 Claims, 15 Drawing Sheets

(52) U.S. Cl.
CPC ...... *H01L 27/3276* (2013.01); *H01L 51/5203* (2013.01); *H01L 51/5209* (2013.01); *H01L 51/5225* (2013.01); *H01L 51/5262* (2013.01); *H01L 51/5253* (2013.01); *H01L 2227/326* (2013.01); *H01L 2251/5361* (2013.01); *Y02B 20/36* (2013.01)

(56) References Cited

U.S. PATENT DOCUMENTS

| | | | |
|---|---|---|---|
| 2006/0086020 | A1 | 4/2006 | Strip et al. |
| 2012/0091498 | A1 | 4/2012 | Chen |
| 2014/0120645 | A1* | 5/2014 | Paek .................. H01L 27/3211 438/35 |
| 2015/0017321 | A1* | 1/2015 | Kudo ...................... H01M 4/00 427/77 |
| 2016/0087248 | A1* | 3/2016 | Paek .................. H01L 27/3211 438/35 |

FOREIGN PATENT DOCUMENTS

| | | |
|---|---|---|
| CN | 103268921 A | 8/2013 |
| CN | 103270816 A | 8/2013 |
| CN | 104206016 A | 12/2014 |
| CN | 106159107 A | 11/2016 |
| JP | 2011257608 A | 12/2011 |
| JP | 2012009254 A | 1/2012 |
| JP | 2014239078 A | 12/2014 |
| KR | 1020100013079 A | 2/2010 |
| KR | 101522822 B1 | 5/2015 |

OTHER PUBLICATIONS

Chinese Office Action dated Aug. 2, 2017.
First Office Action issued by the Indian Patent Office dated Sep. 13, 2019.

* cited by examiner

ORGANIC LIGHT-EMITTING DIODE (OLED) ILLUMINATING LAMP SHEET AND MANUFACTURING METHOD THEREOF

TECHNICAL FIELD

At least one embodiment of the present invention relates to an organic light-emitting diode (OLED) illuminating lamp sheet and a manufacturing method thereof.

BACKGROUND

Along with the mature of OLED technology, OLED lighting also gradually enters the market. The study in recent years indicates that OLED lighting has irreplaceable advantages of high energy efficiency, soft light, uniform distribution, high color rendering index, health and non-irradiation, capability of supporting flexible application and the like.

SUMMARY

At least one embodiment of the present disclosure relates to an organic light-emitting diode (OLED) illuminating lamp sheet and a manufacturing method thereof, and the OLED manufacturing process does not require a fine metal mask (FMM).

At least one embodiment of the present disclosure relates to a method for manufacturing an organic light-emitting diode (OLED) illuminating lamp sheet, comprises: manufacturing an array substrate, the array substrate includes a first base and a first electrode formed on the first base; bonding an electrostatic film to a surface of the array substrate provided with the first electrode, forming a patterned electrostatic film by patterning the electrostatic film, and forming an organic film layer by taking the patterned electrostatic film as a mask; forming a second electrode and obtaining an OLED element; and encapsulating the OLED element.

At least one embodiment of the present disclosure relates to an OLED illuminating lamp sheet, comprises a lamp sheet body, wherein the lamp sheet body includes an illuminating part; regions around an edge of the lamp sheet body include at least one non-light-emitting region; the illuminating part includes a first base and a plurality of OLED elements formed on the first base, and each of the plurality of OLED elements includes a first electrode, a second electrode, and an organic film layer disposed between the first electrode and the second electrode; and the organic film layer is continuously extended in the illuminating part.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 3b is a schematic cross-sectional view of a position where a corresponding external electrode is located in FIG. 3a;

FIG. 4b is a schematic cross-sectional view of an AB position in FIG. 4a;

FIG. 5b is a schematic cross-sectional view of a CD position in FIG. 5a;

FIG. 6b is a schematic top view of an EF position in FIG. 6a;

FIG. 7b is a schematic cross-sectional view of a GH position in FIG. 7a;

FIG. 8b is a schematic cross-sectional view of an IJ position in FIG. 8a;

FIG. 18b is a schematic cross-sectional view of a KL position of the OLED illuminating lamp sheet in FIG. 18a;

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

In a conventional manufacturing process of the OLED illuminating lamp sheet, a fine metal mask (FMM) is needed to be used in a process of forming an organic layer and a cathode. But the FMM is expensive. Moreover, in a manufacturing process, due to the action of a gravity of the FMM itself, a size of a subpixel of the manufactured OLED illuminating lamp sheet corresponding to an edge region of the FMM may be different from a size of a subpixel corresponding to a central region of the FMM. Thus, the luminous brightnesses are different in an edge region and a central region of the OLED illuminating lamp sheet, and a light-emitting is nonuniform.

Figure 1A:
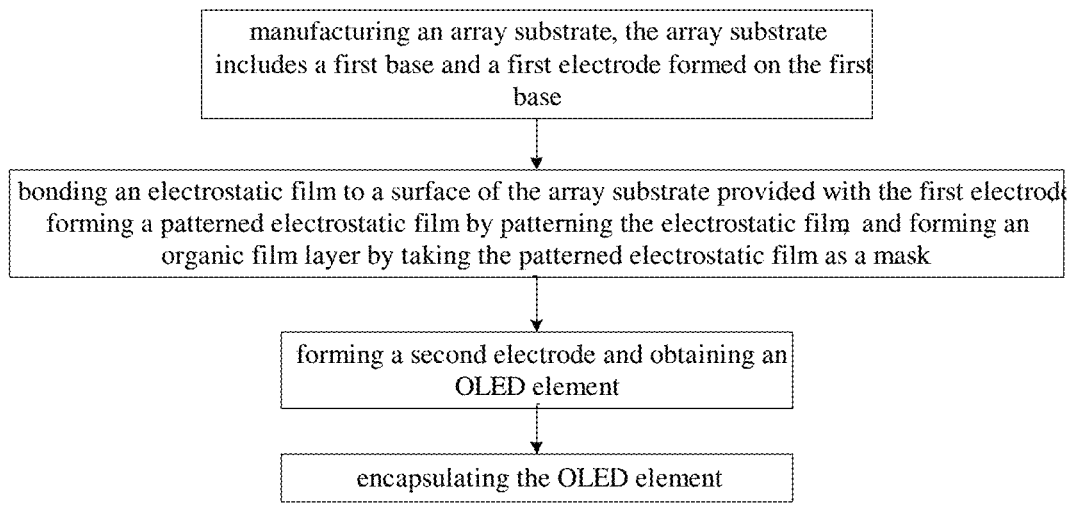
FIG. 1a is a flowchart of a method for manufacturing an OLED illuminating lamp sheet provided by an embodiment of the present invention.

At least one embodiment of the present invention provides a method for manufacturing an OLED illuminating lamp sheet, which, as shown in FIG. 1a, comprises: manufacturing an array substrate, the array substrate includes a first base and a first electrode formed on the first base, bonding an electrostatic film to a surface of the array substrate provided with the first electrode, forming a patterned electrostatic film by patterning the electrostatic film, and forming an organic layer by taking the patterned electrostatic film as a mask; forming a second electrode and obtaining a OLED element; and encapsulating the OLED element.

In the method for manufacturing the OLED illuminating lamp sheet, provided by at least one embodiment of the present invention, an OLED manufacturing process does not require an FMM and adopts the electrostatic film to replace the FMM used in the conventional manufacturing process of the OLED illuminating lamp sheet, so the manufacturing process of the OLED illuminating lamp sheet is simpler and the luminous brightness of the manufactured OLED illuminating lamp sheet is uniform.

A First Embodiment

Figure 1B:
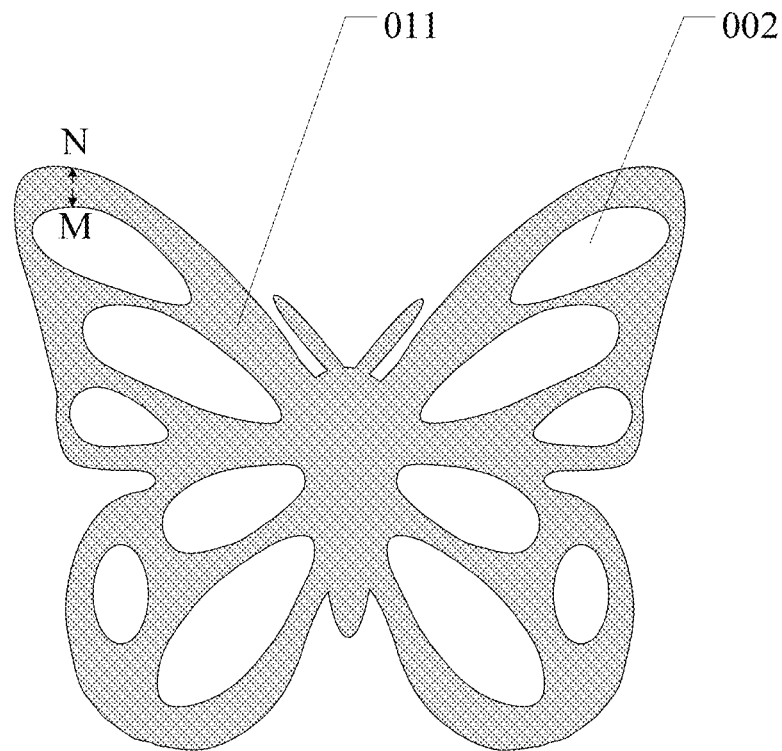
FIG. 1b is a schematic diagram of a light-emitting region in an OLED illuminating lamp sheet provided by an embodiment of the present invention.

Description is given to the method for manufacturing the OLED illuminating lamp sheet by taking a structure as shown in FIG. 1b as an example, but a pattern formed in the embodiment is not limited to a pattern as shown in FIG. 1b. The pattern structure formed in FIG. 1b is a butterfly-like illuminating lamp sheet; a light-emitting region 011 constitutes an illuminating part of the illuminating lamp sheet; the illuminating lamp sheet further includes a non-light-emitting region 002; and the non-light-emitting region 002, for instance, includes an edge encapsulation region. A region where a user can see the brightness is the light-emitting region 011. For instance, the light-emitting region 011 includes a plurality of subpixels.

The method for manufacturing the OLED illuminating lamp sheet, provided by the embodiment, comprises the following steps.

Figure 2A:
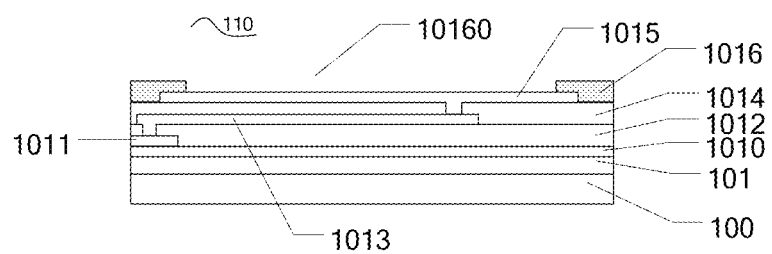
FIG. 2a is a schematic cross-sectional view of an array substrate at a MN position of the OLED illuminating lamp sheet in FIG. 1b.

S1: manufacturing an array substrate 110, as shown in FIG. 2a, the array substrate includes a first base 101 and a first electrode 1015 formed on the first base 101.

For instance, manufacturing the array substrate includes the following steps. The formed array substrate may be as shown in FIG. 2a.

S101: forming a first insulating layer 1010 on the first base 101. The first base 101 is disposed on a substrate 100. The substrate 100, for instance, includes a glass substrate.

S102: forming a pattern of an electrode wiring 1011 on the first insulating layer 1010.

S103: forming a second insulating layer 1012 on the pattern of the electrode wiring 1011, and forming a second insulating layer through hole by patterning the second insulating layer 1012.

S104: forming a pattern of impedance wiring electrode 1013 on the patterned second insulating layer, the impedance wiring electrode 1013 is electrically connected with the electrode wiring 1011 via the second insulating layer through hole.

Due to the arrangement of the impedance wiring electrode 1013, the illuminating lamp sheet can have more uniform light emission. The impedance wiring electrode 1013 may be linear, zigzagged or in other shapes. The impedance wiring electrode 1013 may be disposed in a subpixel region in which the impedance wiring electrode is disposed. A resistance may be adjusted by adjusting a length of the impedance wiring electrode 1013. The impedance wiring electrode 1013 may also be not arranged. No limitation will be given here in the embodiment of the present invention.

S105: forming a third insulating layer 1014 on a pattern of the impedance wiring electrode 1013, and forming a third insulating layer through hole by patterning the third insulating layer 1014.

S106: forming a pattern of a first electrode 1015 on the patterned third insulating layer, the first electrode 1015 is electrically connected with the impedance wiring electrode 1013 via the third insulating layer through hole.

S107: forming a pixel defining layer 1016 on the pattern of the first electrode 1015, to form a pattern of a pixel define region 10160.

Several suitable materials of the layers will be enumerated below. It should be noted that the materials of the layers in the embodiment of the present invention are not limited to the enumerated materials. The first base 101 may include a flexible base, and the material thereof may include polyimide (PI). The materials of the first insulating layer 1010, the second insulating layer 1012, the third insulating layer and the pixel defining layer 1016 may include one or more selected from silicon nitride (SiNx), silicon oxide (SiOx) and silicon oxynitride (SiNxOy). The first insulating layer 1010 may be taken as a buffer layer. The electrode wiring 1011 may adopt low-resistance metal, for instance, may adopt at least one of gold, silver, copper, aluminum, molybdenum and titanium. The first electrode 1015 and the impedance wiring electrode 1013 may be made from transparent conductive materials, for instance, may adopt indium tin oxide (ITO), and may also adopt a superimposed structure, for instance, adopt a superimposed layer of metal and conductive metal oxide, for instance, may adopt a superimposed layer of metal and ITO. The metal includes at least one of gold, silver, copper, aluminum, molybdenum and titanium. For instance, in the superimposed layer, the metal is closer to the first base 101 than ITO.

Figure 2B:
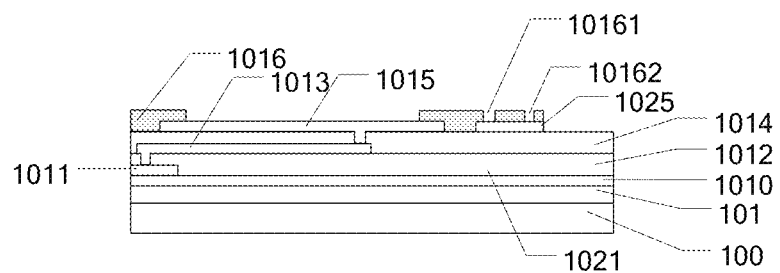
FIG. 2b is a schematic cross-sectional view of an array substrate including an external electrode, in the OLED illuminating lamp sheet provided by an embodiment of the present invention.
Figure 2C:
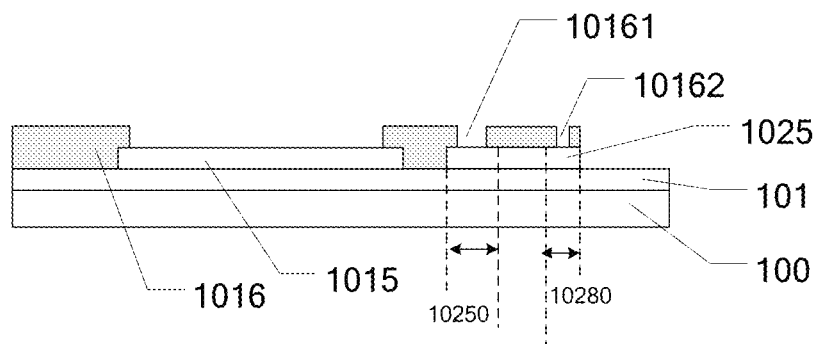
FIG. 2c is a simplified schematic diagram of FIG. 2b.

For instance, as shown in FIG. 2b, manufacturing the array substrate further includes: forming an external electrode 1025. As shown in FIG. 2c, the external electrode 1025 includes a partially overlapping and directly connecting region 10250 and a lead-out electrode region 10280. The external electrode in the partially overlapping and directly connecting region is configured to be overlapped and electrically connected with the second electrode (not shown in FIGS. 2b and 2c, may refer to a second electrode 104 in FIG. 9, and the second electrode is electrically connected with the external electrode). The external electrode 1025 in the lead-out electrode region 10280 is configured to be connected with an external circuit. For instance, the external electrode 1025 may be electrically connected with one end of a power supply. The external electrode 1025 may be independently formed and may also be formed in the same layer with one or more layers in the above steps. In some examples, the first electrode 1015 includes a metal aluminum layer close to the third insulating layer 1014 and ITO disposed on the aluminum layer, and the external electrode 1025 is formed in the same layer with the first electrode 1015 and the external electrode 1025 also includes a metal aluminum layer close to the third insulating layer 1014 and ITO disposed on the aluminum layer. The first electrode 1015 is not electrically connected with the external electrode 1025. The formed structure is as shown in FIG. 2b. For the convenience of description, in the subsequent accompanying drawings, the structure shown in FIG. 2b is simplified as FIG. 2c. In FIG. 2c, the pixel defining layer 1016 includes a first through hole 10161 corresponding to the partially overlapping and directly connecting region 10250, and includes a second through hole 10162 corresponding to the lead-out electrode region 10280. The second electrode is overlapped and electrically connected with the external electrode 1025 via the first through hole 10161. The external electrode is electrically connected with the external electrode 1025 via the second through hole 10162. Of course, the structure and the material of the first electrode 1015 and the external electrode 1025 are not limited to the above description and are only described by taking the case as an example. As for the first electrode, for instance, the first electrode 1015 may be electrically connected with the external circuit through the electrode wiring 1011, but not limited thereto.

It should be noted that description is given in the embodiment of the present invention by taking the array substrate as shown in FIG. 2a as an example, but the array substrate is not limited to the structure as shown in FIG. 2a.

For instance, in a step of forming the array substrate, in order to avoid the reduction of the aperture ratio, the electrode wiring 1011 and the like may be disposed in an edge of the light-emitting region. But the embodiment of the present invention is not limited thereto. In the embodiment of the present invention, the array substrate may be not provided with a subpixel structure in the non-light-emitting region. For instance, the layers such as the first electrode are not formed in the non-light-emitting region of the array substrate. The case may be achieved by shielding of a mask here.

Figure 3A:
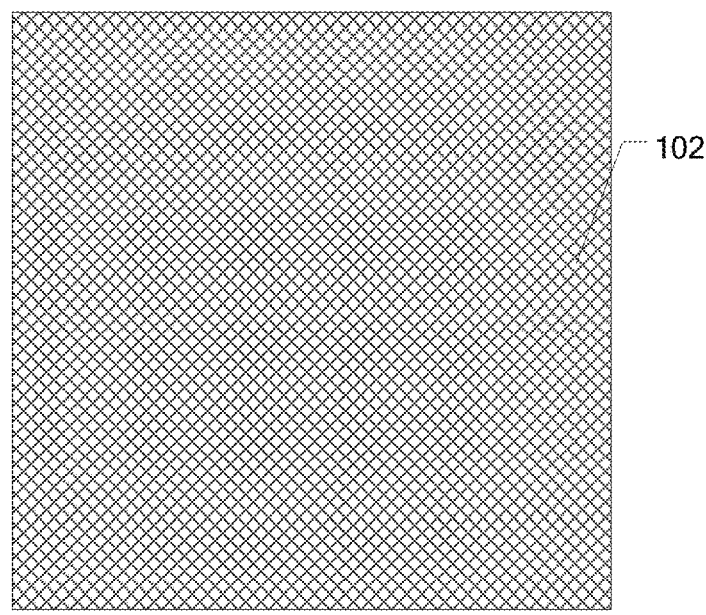
FIG. 3a is a schematic top view of an electrostatic film formed in a method for manufacturing an OLED illuminating lamp sheet provided by an embodiment of the present invention.
Figure 3B:
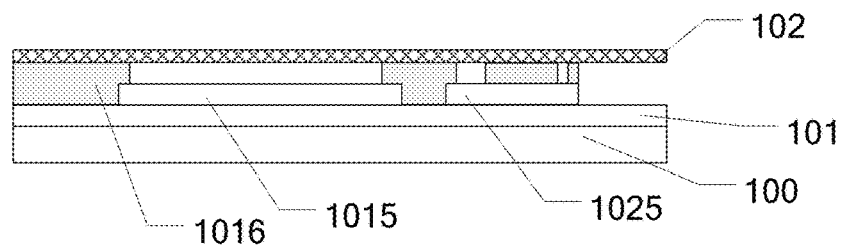
Figure 4A:
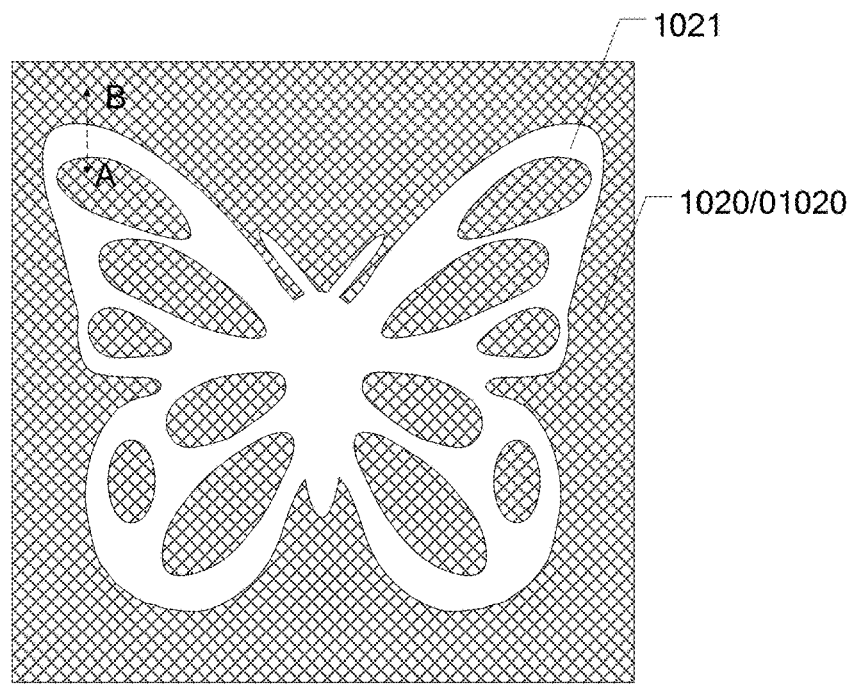
FIG. 4a is a schematic top view of a patterned electrostatic film formed in a method for manufacturing an OLED illuminating lamp sheet, provided by an embodiment of the present invention.
Figure 4B:
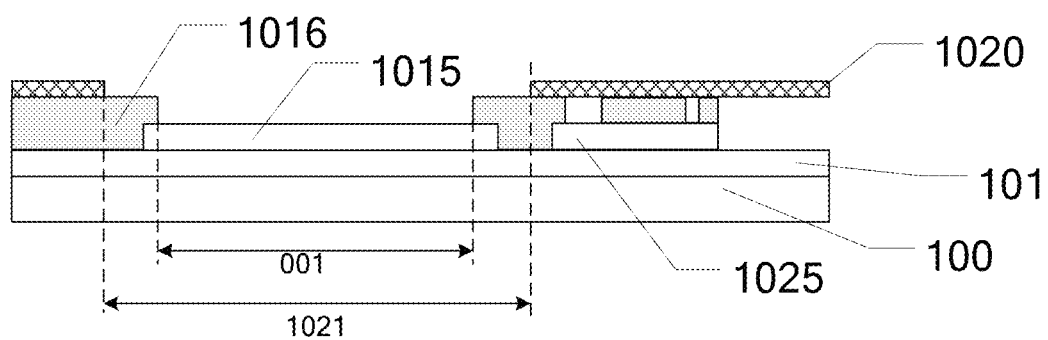
Figure 5A:
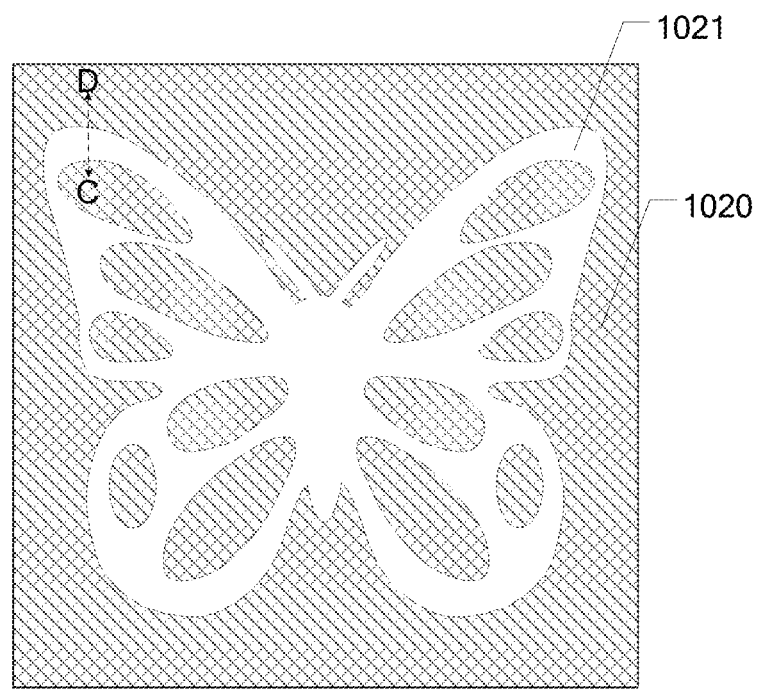
FIG. 5a is a schematic top view of a film of an organic film layer formed in a method for manufacturing an OLED illuminating lamp sheet, provided by an embodiment of the present invention (a film of the organic film layer adopts overall coverage and is subjected to semitransparent treatment)
Figure 5B:
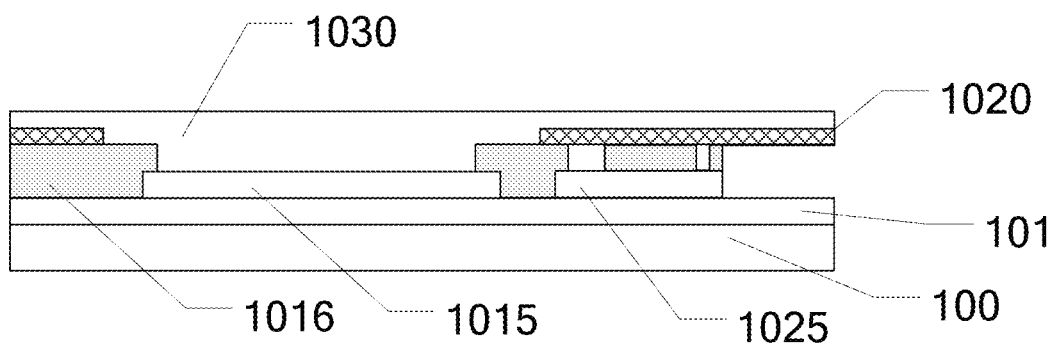

S2: as shown in FIGS. 3a and 3b, bonding an electrostatic film 102 to a surface of the array substrate provided with the first electrode 1015; as shown in FIGS. 4*a* and 4*b*, forming a patterned electrostatic film 1020 by patterning the electrostatic film; and as shown in FIGS. 5*a* and 5*b*, forming a film of an organic film layer (an organic thin film layer) 1030 by taking the patterned electrostatic film 1020 as a mask.

For instance, the film of the organic film layer 1030 is formed by evaporation method. For instance, as shown in FIG. 4*a*, patterning the electrostatic film includes: removing the electrostatic film in a first region 1021, and retaining the electrostatic film as shown in FIGS. 4*a* and 4*b* in a mask region. A portion filled with a pattern in FIG. 4*a* corresponds to the mask region 01020, the first region 1021 is an effective evaporation region. For instance, the first region 1021 is greater than the light-emitting region 011. The effective evaporation region, for instance, corresponds to a region in which the organic film layer is formed.

For instance, patterning the electrostatic film includes: removing the electrostatic film in the first region by a laser cutting technology. For instance, the outline of a region required to be removed may be drawn by a laser, and subsequently the electrostatic film in the region required to be removed is stuck by adhesive tape and removed. In patterning the electrostatic film, semi-cutting effect can be achieved by control of laser energy, namely only cutting the electrostatic film without damage to the first base. It should be noted that removing the electrostatic film is not limited to the above method.

The electrostatic film is a film without a coated glue, does not contain adhesive materials, is a self-adhesive film, utilizes electrostatic adsorption to bond an object, and only relies on static electricity to achieve bonding. For instance, materials of the electrostatic film include but not limited to at least one of PET, PEN, PI, PE and PVC. For instance, the electrostatic film is easy to remove as the electrostatic film only relies on static electricity to achieve bonding.

S3: forming an organic film layer and a second electrode and obtaining an OLED element.

Figure 6A:
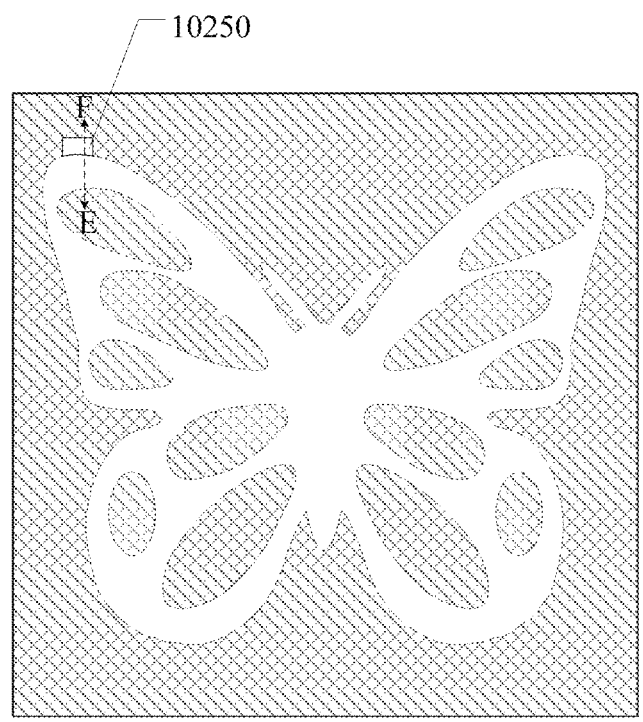
FIG. 6a is a schematic top view illustrating a process of removing an electrostatic film at an partially overlapping and directly connecting region in a method for manufacturing an OLED illuminating lamp pane, provided by an embodiment of the present invention.
Figure 6B:
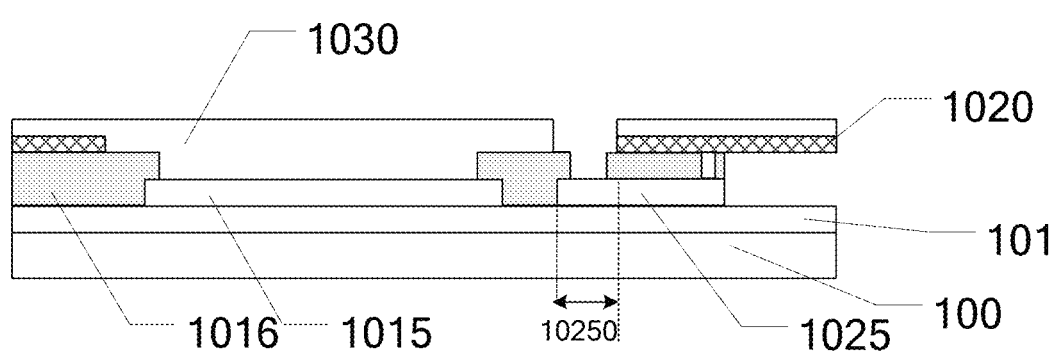
Figure 7A:
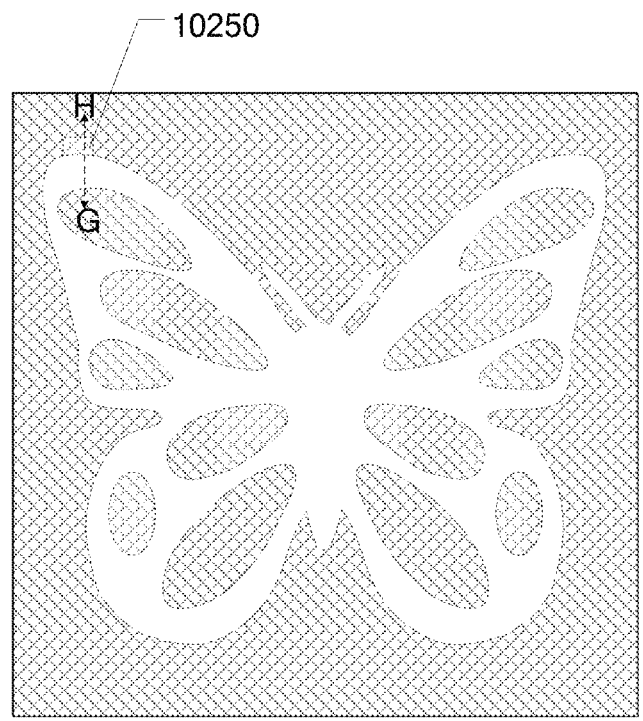
FIG. 7a is a schematic top view of a film of a second electrode formed in a method for manufacturing an OLED illuminating lamp sheet, provided by an embodiment of the present invention (the film of the second electrode adopt overall coverage and is subjected to semitransparent treatment)
Figure 7B:
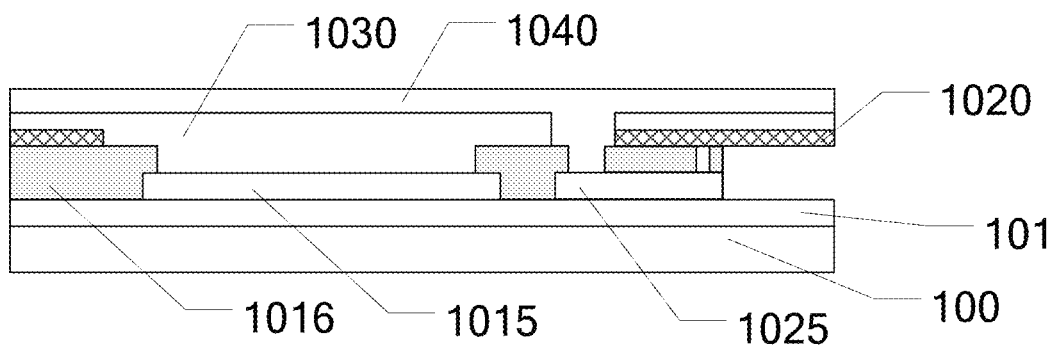
Figure 8A:
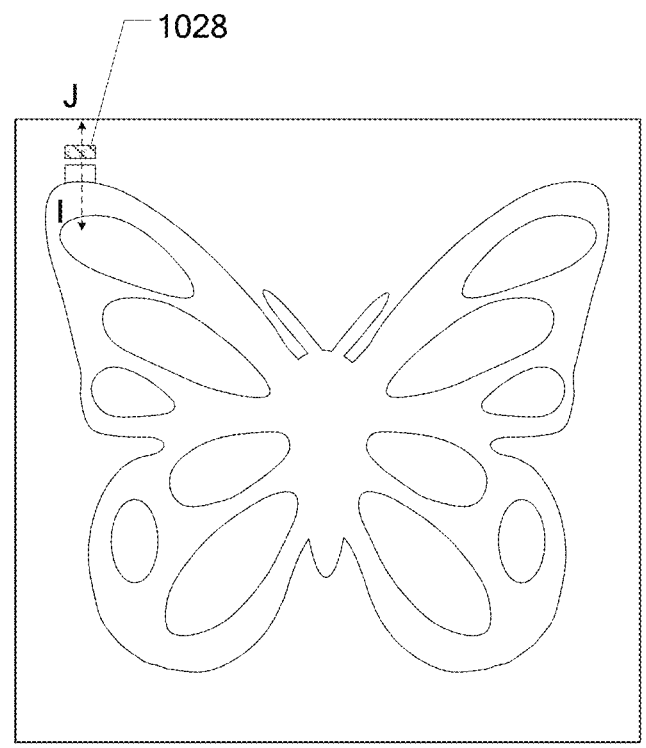
FIG. 8a is a schematic top view illustrating removing an electrostatic film in a mask region except a lead-out electrode region and layers formed thereon in a method for manufacturing an OLED illuminating lamp sheet, provided by an embodiment of the present invention.
Figure 8B:
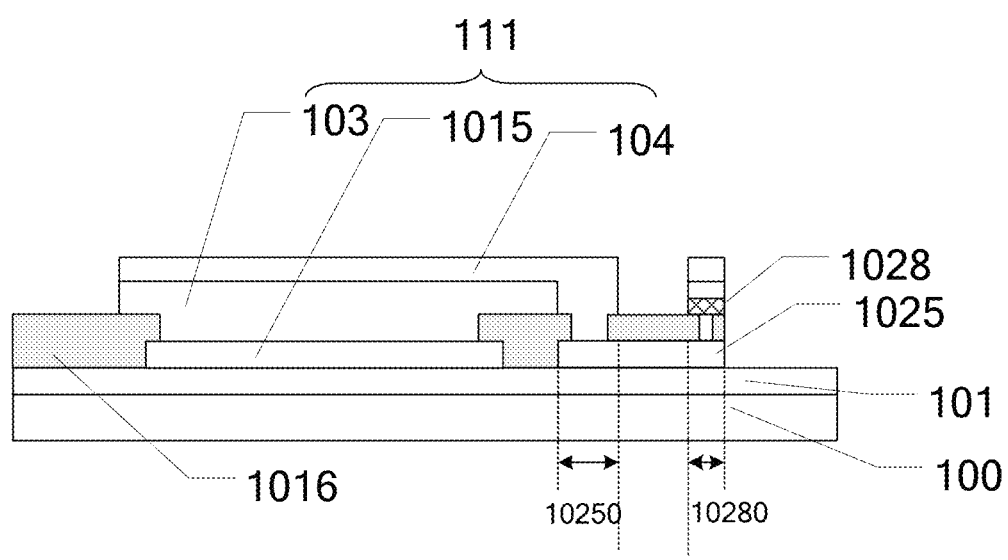
Figure 8C:
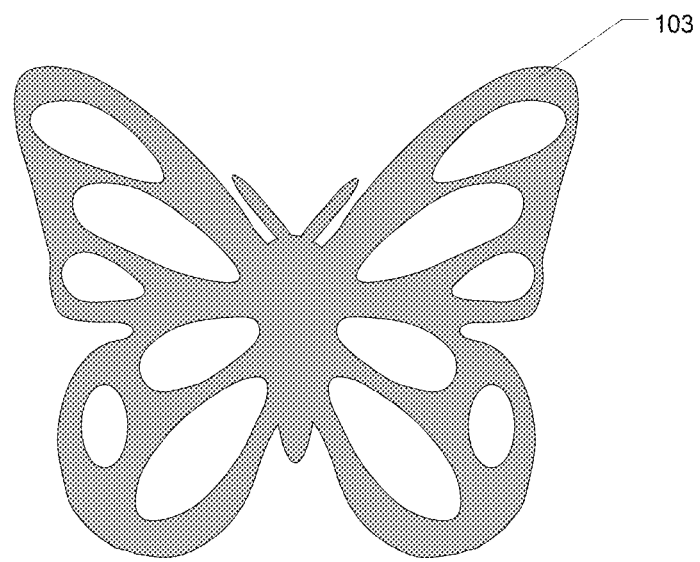
FIG. 8c is a schematic diagram of a formed organic film layer (a pattern of the organic film layer)
Figure 8D:
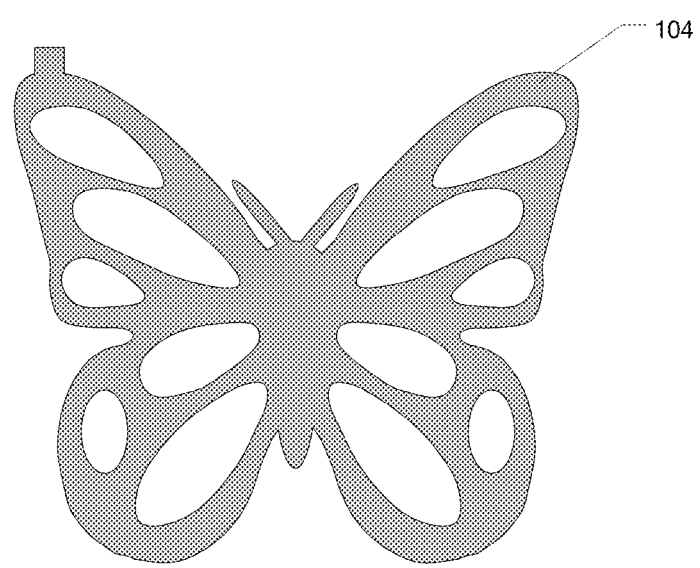
FIG. 8d is a schematic diagram of a formed second electrode (a pattern of the second electrode)

For instance, forming the organic film layer and the second electrode includes: as shown in FIGS. 6*a* and 6*b*, removing the electrostatic film in the partially overlapping and directly connecting region and layers formed thereon in a protective atmosphere, and exposing the partially overlapping and directly connecting region 10250 of the external electrode, and as shown in FIGS. 7*a* and 7*b*, forming a film 1040 of the second electrode; and as shown in FIGS. 8*a* and 8*b*, removing the electrostatic film in the mask region except the lead-out electrode region 10280 and layers formed thereon in a protective atmosphere (the organic thin film layer 1030 and the film 1040 of the second electrode are formed on the electrostatic film in the mask region), and obtaining the organic film layer 103 and the second electrode 104. The second electrode 104 is electrically connected with the external electrode 1025. The formed organic film layer are as shown in FIG. 8*c*. The formed second electrode is as shown in FIG. 8*d*. The electrostatic film 1028 in the mask region in the lead-out electrode region 10280 is as shown in FIG. 8*b*. The protective atmosphere, for instance, includes nitrogen atmosphere, but not limited thereto. In FIG. 8*a*, in order to clearly show the electrostatic film 1028 in the mask region in the lead-out electrode region 10280, the layers on the electrostatic film are subjected to transparent treatment.

S4: encapsulating the OLED element.

Figure 9:
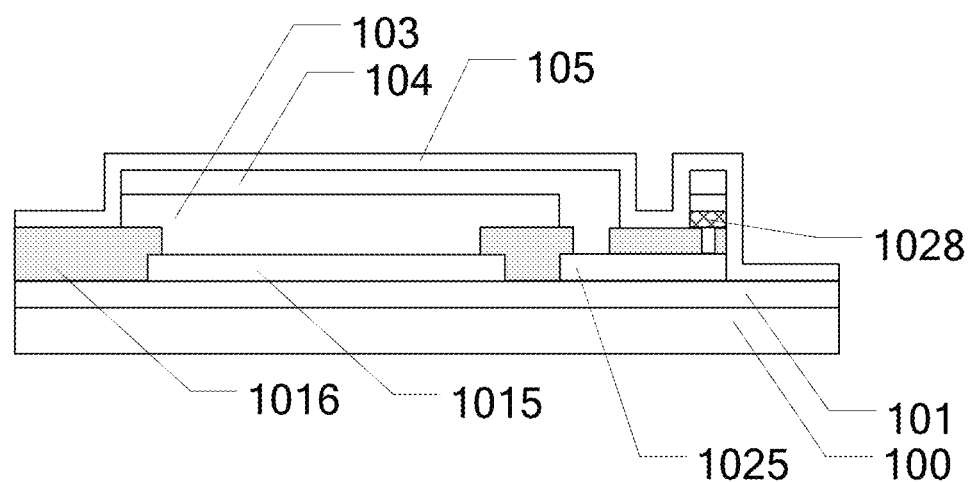
FIG. 9 is a schematic diagram illustrating forming an encapsulation film in the method for manufacturing the OLED illuminating lamp sheet, provided by an embodiment of the present invention.

For instance, encapsulating the OLED element includes: performing film encapsulation after forming the second electrode 104, and a formed encapsulation film 105 is as shown in FIG. 9.

Thus, the OLED illuminating lamp sheet is obtained. In the obtained illuminating lamp sheet, the light-emitting region is in a butterfly-like shape, and the obtained illuminating lamp sheet may be as shown in FIG. 1*b*.

Figure 10:
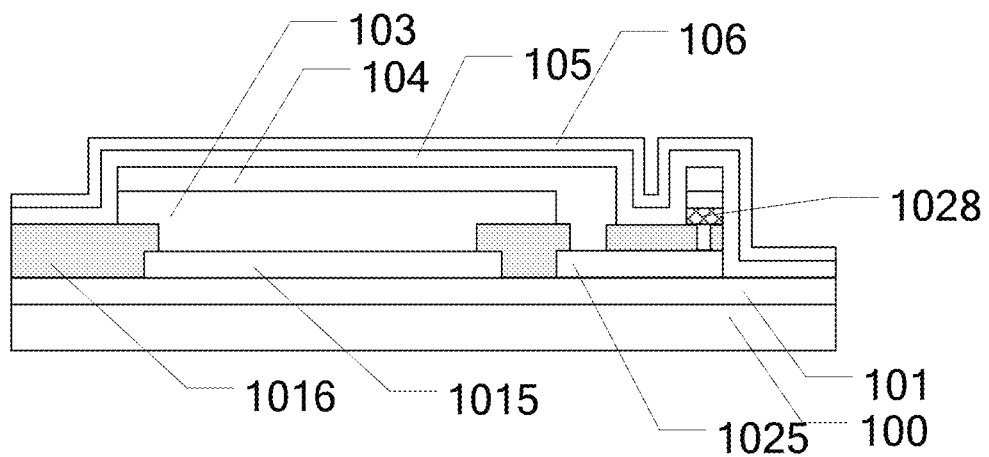
FIG. 10 is a schematic diagram illustrating forming a second base in the method for manufacturing the OLED illuminating lamp sheet, provided by an embodiment of the present invention.

For instance, in order to achieve better waterproof and oxygen proof effect, after film encapsulation, the method may further comprise:

S5: as shown in FIG. 10, bonding a second base 106 to a side of the first base 101 provided with the OLED element.

It should be noted that: in the embodiment of the present invention, the OLED element may include an anode, a hole injection layer (HIL), a hole transport layer (HTL), an emitting layer (EML), an electron transport layer (ETL), an electron injection layer (EIL) and a cathode. For instance, the above layers may be superimposed to each other in sequence. Thus, the organic film layer 103 may include at least one of the HIL, the HTL, the EML, the ETL and the EIL. It should be noted that: in an OLED element provided by another embodiment, at least one of the HIL, the HTL, the ETL and the EIL may also be not arranged. In addition, the above superimposed structure is only illustrative. The OLED element in the embodiment of the present invention may reduce some of the above layers and may also add other layers. For instance, a hole blocking layer, an electron blocking layer and the like may also be included. No limitation will be given here in the embodiment of the present invention. The material of the organic film layer 103 may refer to the prior art, and no further description will be given here.

A Second Embodiment

A conventional OLED illuminating lamp sheet is limited by the manufacturing process and cannot realize a hollowed-out design in the middle, and hence is difficult to have a significant breakthrough in appearance and modeling. The device structure and the manufacturing process provided by the embodiment can effectively solve the problem and provide a wider design space for the modeling design of the lamp sheet.

The OLED illuminating lamp sheet manufactured in the embodiment includes a hollowed-out structure.

The embodiment is based on the first embodiment, and for instance, may also comprise the following steps.

Figure 11A:
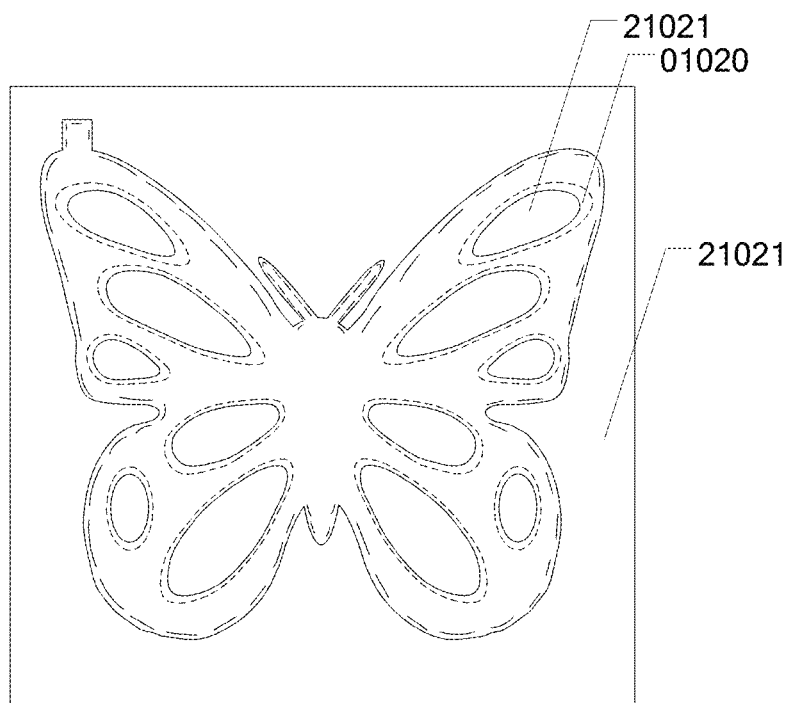
FIG. 11a is a schematic diagram of a mask region and a second region in the method for manufacturing the OLED illuminating lamp sheet, provided by an embodiment of the present invention.
Figure 11B:
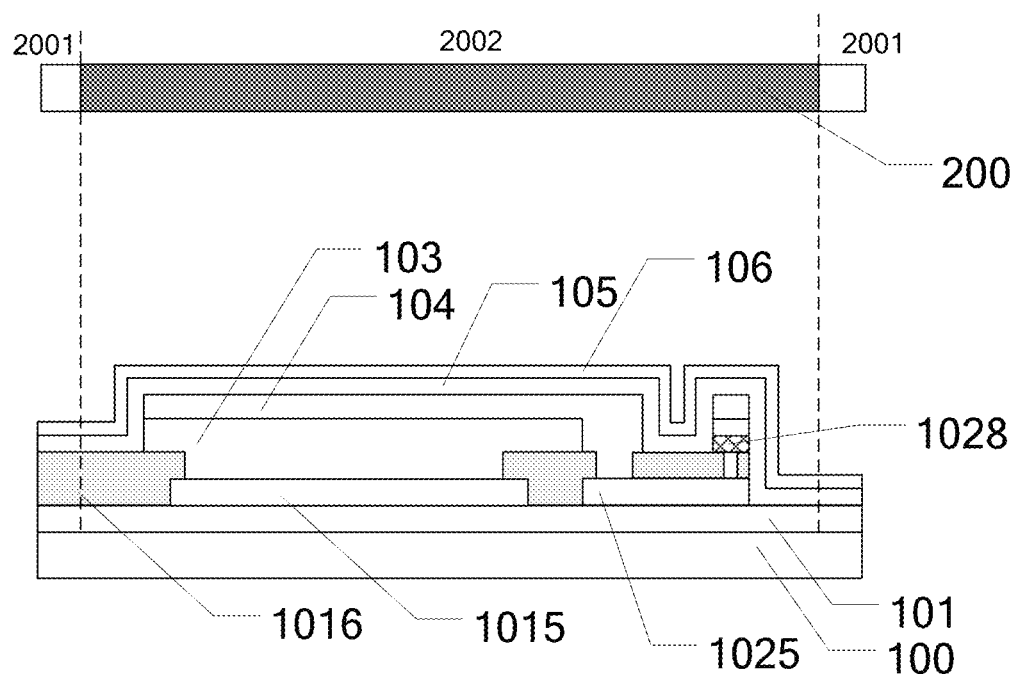
FIG. 11b is a schematic diagram illustrating irradiating a laser to a combination of a first base and a second base via a mask in the method for manufacturing the OLED illuminating lamp sheet, provided by an embodiment of the present invention.

S6: as shown in FIGS. 11*a* and 11*b*, after bonding the second base 106, cutting a combination of the first base 101 and the second base 106 by a laser cutting technology, and removing the first base 101 and the second base 106 in the second region 21021 and layers disposed therebetween. The second region 21021 is located within the mask region 01020 and is smaller than the mask region 01020. Thus, the OLED element can be better encapsulated and also have good water and oxygen resistance after cutting. A pattern of the second region 21021 may refer to a pattern of the mask region 01020. In FIG. 11*a*, in a butterfly-like outline, a dotted line refers to a border of the mask region 01020, and a solid line refers to a border of the second region 21021. The combination of the first base 101 and the second base 106, for instance, refers to a structure obtained after the bonding of the second base 106 to the first base 101.

Figure 12:
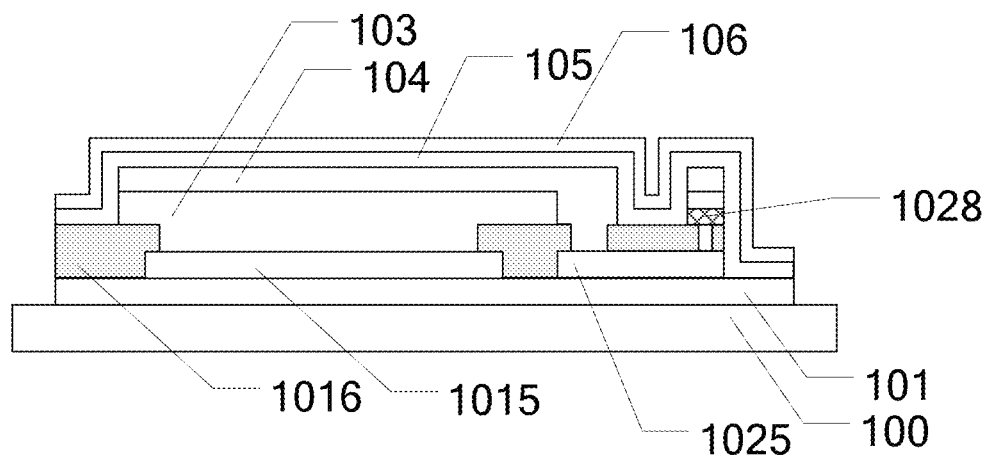
FIG. 12 is a schematic diagram illustrating removing the first base and the second base in the second region and layers disposed therebetween in the method for manufacturing the OLED illuminating lamp sheet, provided by an embodiment of the present invention.

S7: after cutting the combination of the first base 101 and the second base 106, irradiating a laser to the combination of the first base 101 and the second base 106 after cutting via a mask 200, stripping off the first base 101 and the second base 106 disposed in the second region 21021 and layers disposed therebetween, separating a stripped-off portion from a support substrate 100 for holding the first base 101, and obtaining a structure as shown in FIG. 12. A pattern of a mask 200 may be as shown in FIG. 11a. As shown in FIGS. 11a and 11b, a position of the mask 200 corresponding to the second region 21021 is a light-transmitting region 2001, and the remaining regions are opaque regions 2002. The structure obtained after cutting the combination of the first base 101 and the second base 106 and stripping off laser-irradiated portion is as shown in FIG. 12.

Figure 13:
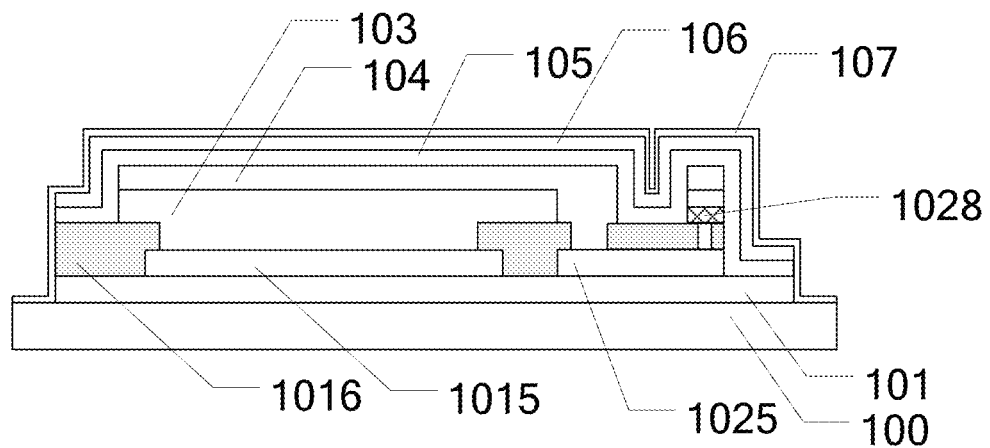
FIG. 13 is a schematic diagram illustrating a process of bonding a first water oxygen barrier layer in the method for manufacturing the OLED illuminating lamp sheet, provided by an embodiment of the present invention.

S8: after separating the stripped-off portion from the support substrate 100 for holding the first base 101, as shown in FIG. 13, bonding a first water oxygen barrier layer 107 to the second base 106 obtained after removing the stripped-off portion. For instance, the first water oxygen barrier layer 107 is bonded on an entire surface.

Figure 14:
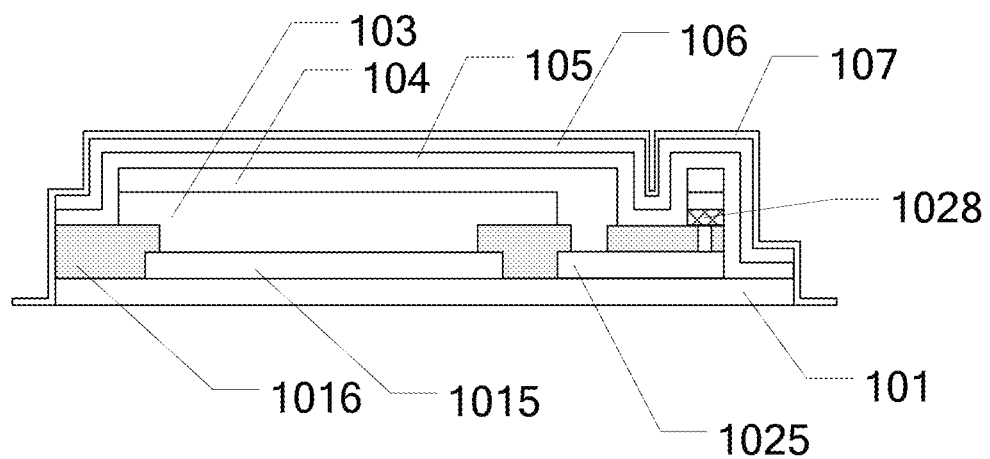
FIG. 14 is a schematic diagram illustrating a process of separating the first base from a support substrate for holding the first base in the method for manufacturing the OLED illuminating lamp sheet, provided by an embodiment of the present invention.

S9: irradiating a laser to the support substrate 100 for holding the first base 101, and completely separating the first base 101 from the support substrate 100 for holding the first base 101. The separated structure is as shown in FIG. 14.

Figure 15:
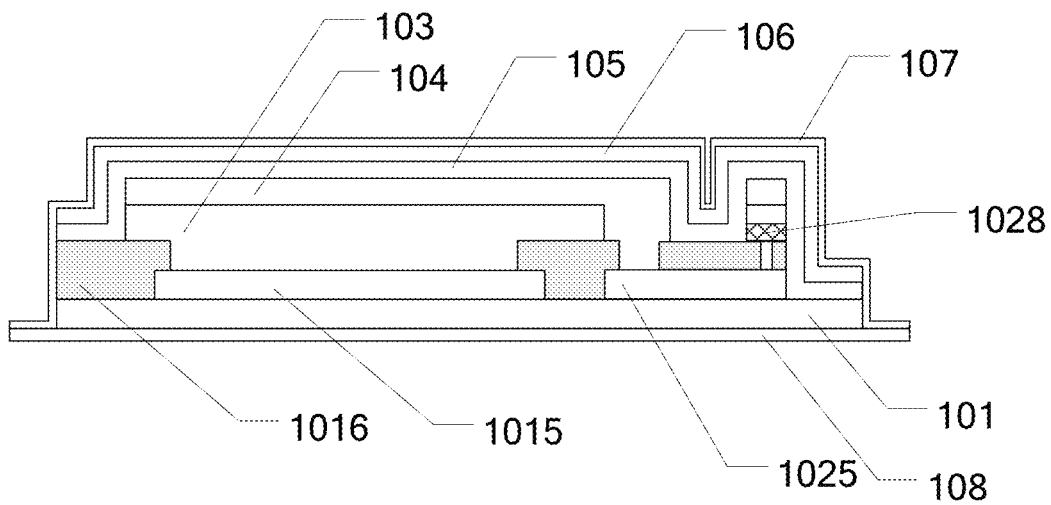
FIG. 15 is a schematic diagram illustrating a process of bonding a second water oxygen barrier layer in the method for manufacturing the OLED illuminating lamp sheet, provided by an embodiment of the present invention.

S10: after completely separating the first base 101, obtained after removing the stripped-off portion, from the support substrate 100 for holding the first base 101, as shown in FIG. 15, bonding a second water oxygen barrier layer 108 to a surface of the first base 101, obtained after removing the stripped-off portion, away from the OLED element. For instance, the second water oxygen barrier layer 108 is bonded on an entire surface.

Figure 16A:
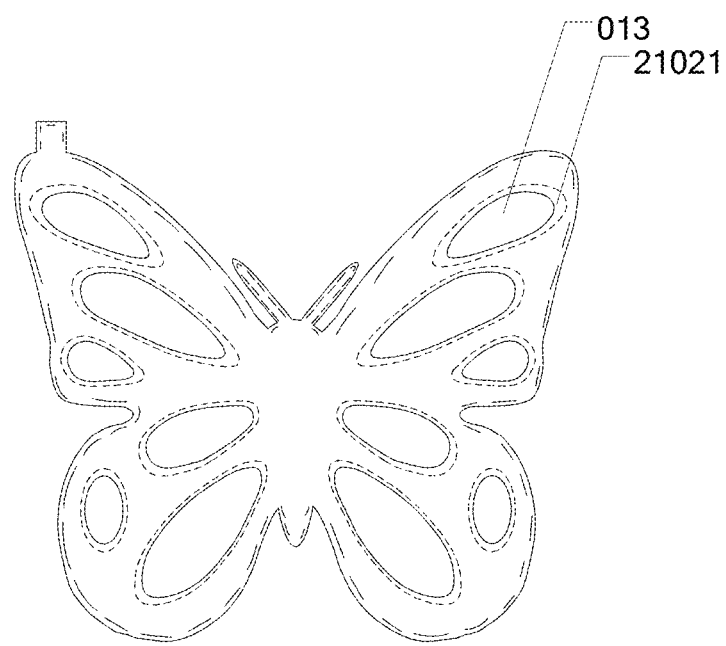
FIG. 16a is a schematic diagram of a hollowed-out region and a second region in the method for manufacturing the OLED illuminating lamp sheet, provided by an embodiment of the present invention.
Figure 16B:
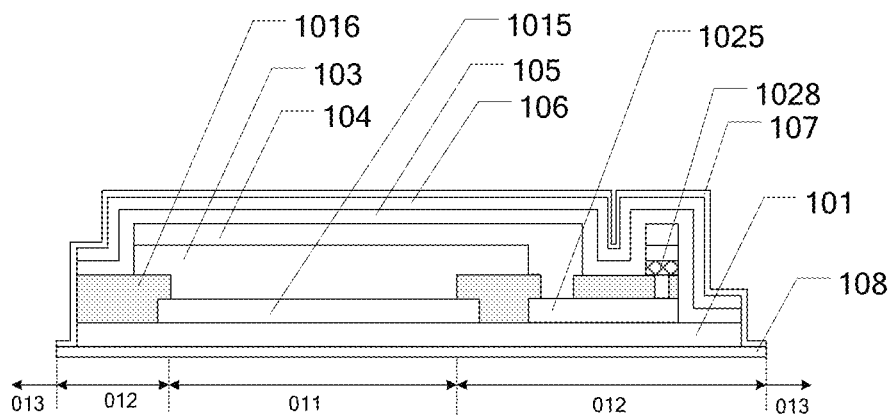
FIG. 16b is a schematic diagram illustrating a process of forming the hollowed-out region by cutting after bonding the first water oxygen barrier layer and the second water oxygen barrier layer in the method for manufacturing the OLED illuminating lamp sheet, provided by an embodiment of the present invention.

S11: after bonding the first water oxygen barrier layer 107 and the second water oxygen barrier layer 108, cutting a combination of the first water oxygen barrier layer 107 and the second water oxygen barrier layer 108 by laser cutting technology, and forming a hollowed-out region 013, as shown in FIGS. 16a and 16b. As shown in FIG. 16a, the hollowed-out region 013 falls within the second region 21021 and is smaller than the second region 21021. Thus, the OLED element can be better encapsulated and can also have good water and oxygen resistance after cutting. For instance, a cutting portion (the hollowed-out region) includes the first water oxygen barrier layer 107 and the second water oxygen barrier layer 108. Patterns of the hollowed-out region 013 and the second region 21021 may be as shown in FIG. 16a. In FIG. 16a, in a butterfly-like outline, a dotted line refers to a border of the second region 21021, and a solid line refers to a border of the hollowed-out region 013. The obtained structure may be as shown in FIG. 16b. FIG. 16b also shows a light-emitting region 011 and edge encapsulation regions 012. The combination of the first water oxygen barrier layer 107 and the second water oxygen barrier layer 108, for instance, refers to a structure obtained after the bonding of the first water oxygen barrier layer 107 and the second water oxygen barrier layer 108.

In the method provided by the embodiment, the arrangement of the first water oxygen barrier layer 107 and the second water oxygen barrier layer 108 can further improve the water and oxygen resistant encapsulation effect and can improve the service life and the durability of the illuminating lamp sheet. Moreover, the hollowed-out design can realize the compatibility of the service life of the OLED and the modeling of the lamp sheet.

The method provided by the embodiment can support various complex hollowed-out design proposals of flexible OLED lamp sheet, and provide a larger space for the modeling design of the lamp sheet.

A Third Embodiment

The OLED illuminating lamp sheet manufactured by the embodiment also includes a hollowed-out structure.

Figure 17:
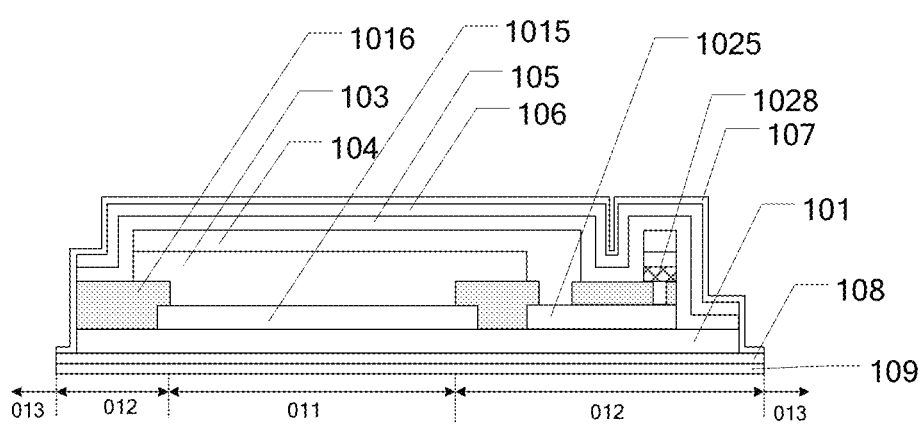
FIG. 17 is a schematic diagram illustrating a process of forming the hollowed-out region by cutting after bonding a light extraction film in the method for manufacturing the OLED illuminating lamp sheet, provided by an embodiment of the present invention.

The embodiment is based on the second embodiment. For instance, as shown in FIG. 17, in order to improve the light extraction efficiency, after bonding the first water oxygen barrier layer 107 and the second water oxygen barrier layer 108 and before cutting the combination of the first water oxygen barrier layer 107 and the second water oxygen barrier layer 108, the embodiment further comprises: bonding a light extraction film 109 to at least one of the first water oxygen barrier layer 107 and the second water oxygen barrier layer 108. Thus, after bonding the light extraction film 109, a combination of the first water oxygen barrier layer 107, the second water oxygen barrier layer 108 and the light extraction film 109 may be cut by utilization of laser cutting technology to form hollowed-out regions 013. Similarly, the hollowed-out region 013 falls within the second region 21021 and is smaller than the second region 21021. For instance, a cutting portion (the hollowed-out region) includes the first water oxygen barrier layer 107, the second water oxygen barrier layer 108 and the light extraction film 109.

A Fourth Embodiment

On the basis of the first embodiment, in order to further achieve the water and oxygen resistant effect, the embodiment bonding at least one of the first water oxygen barrier layer 107 and the second water oxygen barrier layer 108.

For instance, after bonding the second base 106, the first water oxygen barrier layer 107 is bonded to the second base 106.

For instance, after bonding the first water oxygen barrier layer 107, the first base 101 is separated from the support substrate 100 for holding the first base 101.

For instance, after separating the first base 101 from the support substrate 100 for holding the first base 101, the second water oxygen barrier layer 108 is bonded to a surface of the first base 101 away from the OLED element.

A Fifth Embodiment

On the basis of the fourth embodiment, in order to improve the light extraction efficiency, the embodiment further comprises: bonding a light extraction film 109 to at least one of the first water oxygen barrier layer 107 and the second water oxygen barrier layer 108.

In the embodiment, the non-light-emitting region may include the first base 101, the second base 106, the first water oxygen barrier layer 107, the second water oxygen barrier layer 108 and the light extraction film 109.

Several materials of the layers will be enumerated below. It should be noted that the materials of the layers in the embodiment of the present invention are not limited to the enumerated cases. For instance, the materials of the second base 106, the first water oxygen barrier layer 107 and the second water oxygen barrier layer 108 may include PI, PET, PEN, etc. The encapsulation film 105 may include at least one of an organic encapsulation film and an inorganic encapsulation film. For instance, one organic encapsulation film may be encapsulated after the encapsulation of one inorganic encapsulation film, but not limited thereto. The inorganic encapsulation film may include a silicon nitride film, and the organic encapsulation film may include hexamethyl disiloxane (HMDSO), but not limited thereto. The description relevant to the light extraction film 109 may refer to the conventional design For instance, in the above embodiments, the first electrode is an anode and the second electrode is a cathode, but not limited thereto.

Description is given in the above embodiments of the present invention by taking the case that a region in which a cross-section line is located includes one subpixel as an example. But in the embodiment of the present invention, the region in which the cross-section line is located may include a plurality of subpixels. No limitation will be given here in the embodiment of the present invention.

The cutting in the embodiment of the present invention may adopt laser cutting, but not limited thereto. For instance, mechanical cutting means may also be adopted for cutting.

For instance, in the embodiment of the present invention, forming film, for instance, refers to forming film on the entire face, and the film may be taken as a film to be patterned, and patterned to obtain a required pattern. For instance, the forming film may adopt evaporation, magnetron sputtering, etc.

For instance, in the embodiment of the present invention, the encapsulation film 105, the second base 106, the first water oxygen barrier layer 107 and the second water oxygen barrier layer 108 may be bonding to the entire face. That is to say, the encapsulation film 105, the second base 106, the first water oxygen barrier layer 107 and the second water oxygen barrier layer 108 are planar-like films.

A Sixth Embodiment

Figure 18A:
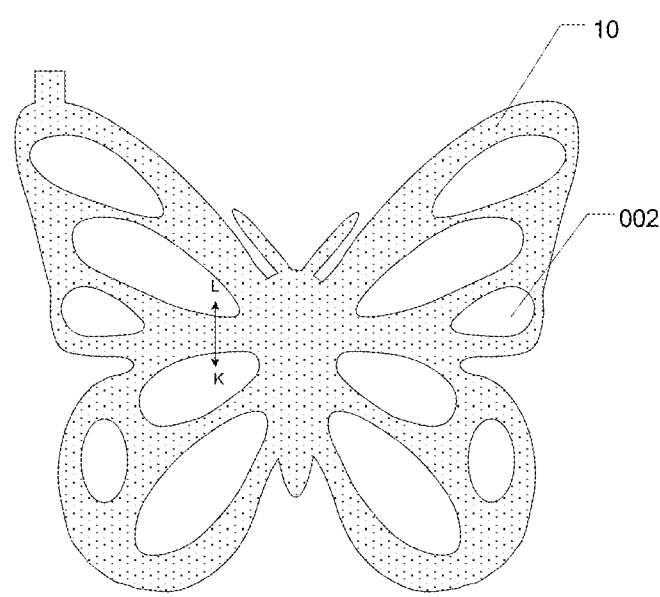
FIG. 18a is a schematic diagram of a final shape of an OLED element formed in the method for manufacturing the OLED illuminating lamp sheet, provided by an embodiment of the present invention (the illuminating lamp sheet does not have a hollowed-out structure)
Figure 18B:
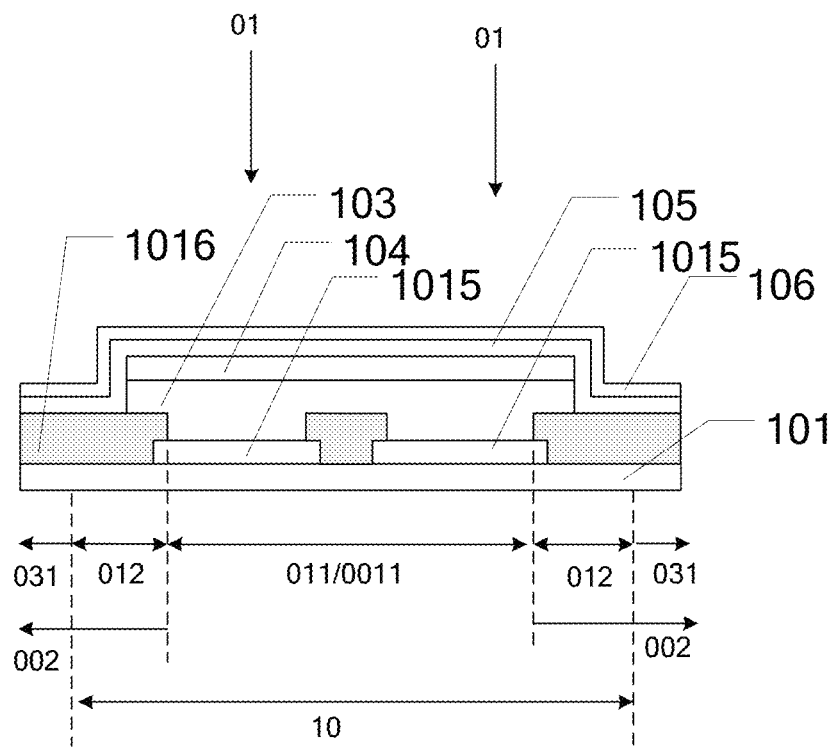

The embodiment provides an OLED illuminating lamp sheet, which, as shown in FIGS. 18a and 18b, comprises a lamp sheet body 10. The lamp sheet body includes an illuminating part 0011. Regions around the lamp sheet body include at least one non-light-emitting region 002.

The illuminating part 0011 includes a first base 101 and a plurality of OLED elements 111 formed on the first base 101 (as shown in FIG. 8b). The OLED element 111 includes a first electrode 1015, a second electrode 104 and an organic film layer 103 disposed between the first electrode 1015 and the second electrode 104. The organic film layer 103 is continuously extended in the illuminating part.

As shown in FIG. 18b, the non-light-emitting region 002 includes an edge encapsulation region 012 and also includes a third region 031. For instance, the third region 031 is not provided with a pixel structure and does not emit light.

FIG. 18b may correspond to the illuminating lamp sheet formed in the first embodiment. The illuminating lamp sheet formed in the fourth embodiment and the fifth embodiment may also be as shown in FIG. 18a.

For instance, the first electrode 1015 of the OLED element is independently disposed in the OLED element provided with the first electrode, and the second electrode 104 is continuously extended in the illuminating part. That is to say, the first electrode 1015 is discrete. A plurality of independent first electrodes 1015 are disposed on the first base. For instance, each subpixel 01 is provided with one first electrode 1015.

For instance, a plurality of OLED elements are encapsulated by the encapsulation film 105, and a second base 106 is disposed on a surface of the encapsulation film 105 away from the first base 101.

For instance, a first water oxygen barrier layer 107 may also be disposed on a surface of the second base 106 away from the encapsulation film 105, and a second water oxygen barrier layer 108 may also be disposed on a surface of the first base 101 away from the second base 106.

The OLED illuminating lamp sheet provided by the embodiment may be formed by the method provided by the first embodiment, the fourth embodiment or the fifth embodiment. For instance, the illuminating part 0011 may correspond to the light-emitting region 011 as described above.

A Seventh Embodiment

Figure 19:
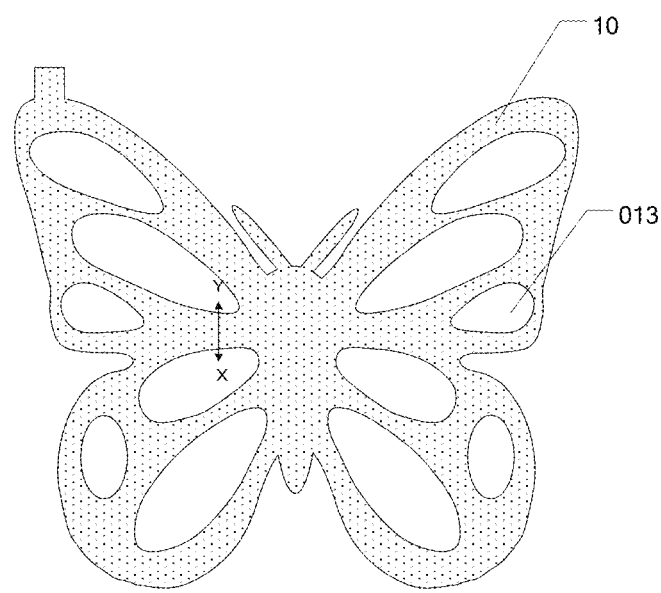
FIG. 19 is a schematic diagram of a final shape of the OLED element formed in the method for manufacturing the OLED illuminating lamp sheet, provided by an embodiment of the present invention (the illuminating lamp sheet has a hollowed-out structure)
Figure 20:
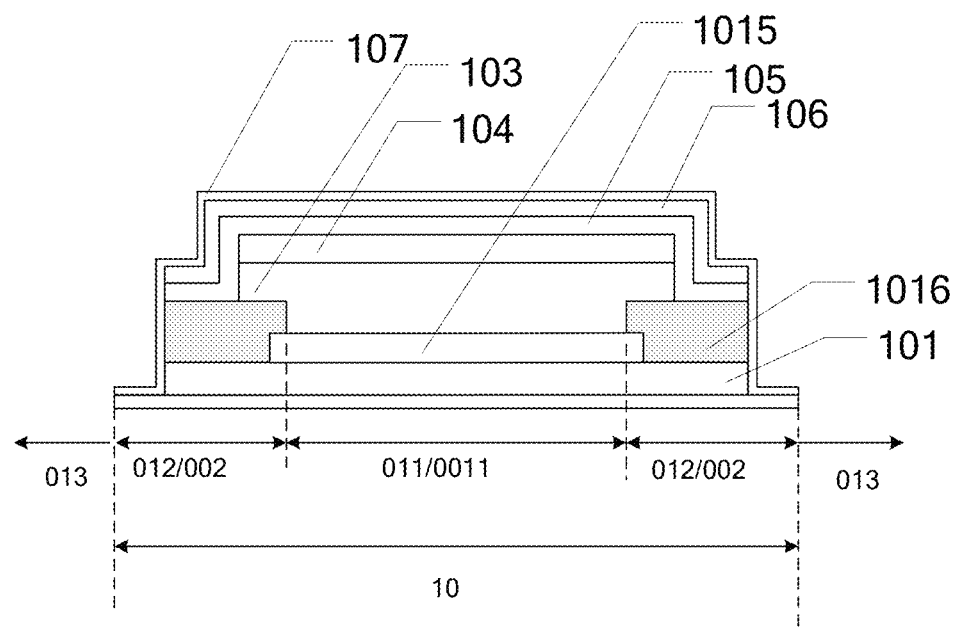
FIG. 20 is a schematic cross-sectional view of an XY position of the OLED illuminating lamp sheet in FIG. 19 (a lamp sheet body between adjacent hollowed-out regions or adjacent non-light-emitting regions includes one subpixel)

As shown in FIG. 19, an OLED illuminating lamp sheet provided by the embodiment includes a hollowed-out structure. For instance, as shown in FIG. 20, the non-light-emitting region 002 includes a hollowed-out region 013 and an edge encapsulation region 012. The first water oxygen barrier layer 107 and the second water oxygen barrier layer 108 are bonded together at a position of the lamp sheet body close to the hollowed-out region 013 and at an edge of the lamp sheet body.

Figure 21:
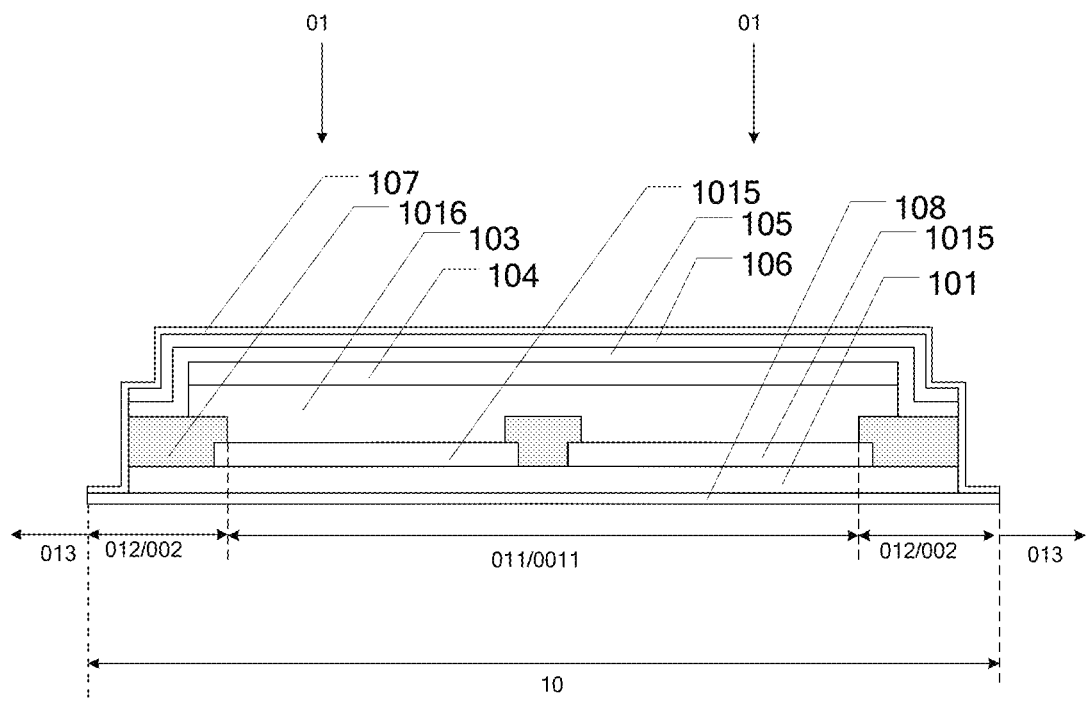
FIG. 21 is a schematic cross-sectional view of an XY position of the OLED illuminating lamp sheet in FIG. 19 (the lamp sheet body between adjacent hollowed-out regions or adjacent non-light-emitting regions includes two subpixels).

FIGS. 19 and 20 are schematic cross-sectional views of a KL position in FIG. 18b. FIG. 20 shows a case that one subpixel 01 is disposed at the KL position. FIG. 21 shows the case that two subpixels 01 are disposed at the KL position. It should be noted that FIGS. 20 and 21 are only given for the convenience of description, and a plurality of subpixels may also be disposed at the KL position. No limitation will be given here in the embodiment of the present invention.

FIGS. 19 and 20 may correspond to the illuminating lamp sheet manufactured in the second embodiment. The illuminating lamp sheet in the third embodiment may also refer to FIG. 18.

For instance, one portion may also be removed from the non-light-emitting region in the sixth embodiment to obtain the illuminating lamp sheet having the hollowed-out structure. For instance, in the structure corresponding to FIG. 18b, the third region 031 may be removed to obtain the illuminating lamp sheet having the hollowed-out structure.

The following statements should be noted:

(1) In the embodiments of the present disclosure and the accompanying drawings, the same reference number refers to the same meaning, unless otherwise stated.

(2) The accompanying drawings involve only the structure(s) in connection with the embodiment(s) of the present disclosure, and other structure(s) can be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

(4) In case of no conflict, features in one embodiment or in different embodiments can be combined.

The application claims priority to the Chinese patent application No. 201610647462.1, filed Aug. 9, 2016, the disclosure of which is incorporated herein by reference as part of the application.

The invention claimed is:

1. A method for manufacturing an organic light-emitting diode (OLED) illuminating lamp sheet, comprising:
   manufacturing an array substrate, the array substrate includes a first base and a first electrode formed on the first base, wherein the manufacturing the array substrate includes:

forming a first insulating layer on the first base;
forming a pattern of an electrode wiring on the first insulating layer;
forming a second insulating layer on the pattern of the electrode wiring, and forming a second insulating layer through hole by patterning the second insulating layer;
forming a pattern of an impedance wiring electrode on the patterned second insulating layer, the impedance wiring electrode is electrically connected with the electrode wiring via the second insulating layer through hole;
forming a third insulating layer on the pattern of the impedance wiring electrode, and forming a third insulating layer through hole by patterning the third insulating layer;
forming a pattern of the first electrode and an external electrode on the patterned third insulating layer, the first electrode is electrically connected with the impedance wiring electrode via the third insulating layer through hole; and
forming a pattern of a pixel define region by forming pixel defining layer (PDL) on the pattern of the first electrode and the external electrode,
wherein the external electrode includes a partially overlapping and directly connecting region which is partially overlapped with the second electrode and directly connected with the second electrode by the pixel defining layer and a lead-out electrode region, the pixel defining layer includes a first through hole corresponding to the partially overlapping and directly connecting region and a second through hole corresponding to the lead-out electrode region;
bonding an electrostatic film to a surface of the array substrate provided with the first electrode, forming a patterned electrostatic film by patterning the electrostatic film, and forming an organic film layer by taking the patterned electrostatic film as a mask;
forming a second electrode and obtaining an OLED element; and
encapsulating the OLED element,
wherein the forming the organic film layer and the second electrode includes:
forming a film of the organic film layer which covers the array substrate after forming the patterned electrostatic film,
under a protective atmosphere, removing the patterned electrostatic film and the film of the organic film layer formed on the patterned electrostatic film in the partially overlapping and directly connecting region, to expose the external electrode in partially overlapping and directly connecting region,
forming a film of the second electrode on a side of the array substrate where the patterned electrostatic film is located, wherein the film of the second electrode covers the first through hole so that the second electrode is connected with the external electrode in the partially overlapping and directly connecting region by the pixel defining layer and the second electrode is partially overlapped with the external electrode;
removing the patterned electrostatic film, and the film of the organic film layer and the film of the second electrode on the patterned electrostatic film in a mask region except the lead-out electrode region in a protective atmosphere and obtaining the organic film layer and the second electrode.

2. The method for manufacturing the OLED illuminating lamp sheet according to claim 1, wherein a film of the organic film layer is formed by an evaporation method,
the patterning the electrostatic film includes:
removing the electrostatic film in a first region and retaining the electrostatic film in a mask region,
wherein the first region is an effective evaporation region, the effective evaporation region corresponds to a region where the organic film layer to be formed is located.

3. The method for manufacturing the OLED illuminating lamp sheet according to claim 2, wherein the patterning the electrostatic film includes: removing the electrostatic film in a first region by a laser cutting technology.

4. The method for manufacturing the OLED illuminating lamp sheet according to claim 2, wherein materials of the electrostatic film include at least one of polyethylene terephthalate (PET), polyethylene naphthalene (PEN), polyimide (PI), polyethylene (PE) and polyvinyl chloride (PVC).

5. The method for manufacturing the OLED illuminating lamp sheet according to claim 1, wherein the patterning the electrostatic film includes: removing the electrostatic film in a first region by a laser cutting technology.

6. The method for manufacturing the OLED illuminating lamp sheet according to claim 5, wherein materials of the electrostatic film include at least one of polyethylene terephthalate (PET), polyethylene naphthalene (PEN), polyimide (PI), polyethylene (PE) and polyvinyl chloride (PVC).

7. The method for manufacturing the OLED illuminating lamp sheet according to claim 1, wherein after encapsulating the OLED element, a second base is bonded to a side of the first base provided with the OLED element.

8. The method for manufacturing the OLED illuminating lamp sheet according to claim 7, wherein after bonding the second base, a first water oxygen barrier layer is bonded to the second base;
after bonding the first water oxygen barrier layer, the first base is separated from a support substrate for holding the first base; and
after separating the first base from the support substrate, a second water oxygen barrier layer is bonded to a surface of the first base away from the OLED element.

9. The method for manufacturing the OLED illuminating lamp sheet according to claim 8, further comprising: bonding a light extraction film to at least one of the first water oxygen barrier layer and the second water oxygen barrier layer.

10. The method for manufacturing the OLED illuminating lamp sheet according to claim 7, wherein after bonding the second base, a combination of the first base and the second base is cut, and the first base and the second base and layers disposed between the first base and the second base in a second region are removed; and the second region is located within the mask region and is smaller than the mask region.

11. The method for manufacturing the OLED illuminating lamp sheet according to claim 10, wherein the removing the first base and the second base and layers disposed between the first base and the second base in a second region includes:
irradiating a laser to the combination of the first base and the second base in the second region after cutting via a mask,
stripping off the first base and the second base and layers disposed between the first base and the second base in the second region, and
separating a stripped-off portion from the support substrate for holding the first base.

12. The method for manufacturing the OLED illuminating lamp sheet according to claim 11, wherein
  after the separating the stripped-off portion from the support substrate, bonding a first water oxygen barrier layer to the second base obtained after removing the stripped-off portion;
  irradiating a laser to the support substrate, and completely separating the first base and the support substrate; and
  after the completely separating the first base and the support substrate obtained after removing the stripped-off portion, bonding a second water oxygen barrier layer to a surface of the first base, obtained after removing the stripped-off portion, away from the OLED element.

13. The method for manufacturing the OLED illuminating lamp sheet according to claim 12, wherein after the bonding the first water oxygen barrier layer and the second water oxygen barrier layer, a combination of the first water oxygen barrier layer and the second water oxygen barrier layer is cut to form a hollowed-out region; and the hollowed-out region is located within the second region and is smaller than the second region.

14. The method for manufacturing the OLED illuminating lamp sheet according to claim 13, after the bonding the first water oxygen barrier layer and the second water oxygen barrier layer and before cutting, further comprising: bonding a light extraction film to at least one of the first water oxygen barrier layer and the second water oxygen barrier layer.

15. The method for manufacturing the OLED illuminating lamp sheet according to claim 1, wherein materials of the electrostatic film include at least one of polyethylene terephthalate (PET), polyethylene naphthalene (PEN), polyimide (PI), polyethylene (PE) and polyvinyl chloride (PVC).

* * * * *